US007607879B2

(12) United States Patent
Hall et al.

(10) Patent No.: US 7,607,879 B2
(45) Date of Patent: Oct. 27, 2009

(54) SUBSTRATE PROCESSING APPARATUS WITH REMOVABLE COMPONENT MODULE

(75) Inventors: Daniel A. Hall, West Newbury, MA (US); Christopher Hofmeister, Hampstead, NH (US); William Fosnight, Carlisle, MA (US); Robert T. Caveney, Windham, NH (US); Ulysses Gilchrist, Reading, MA (US); Jeff G. Araujo, Tyngsboro, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 70 days.

(21) Appl. No.: 11/154,787

(22) Filed: Jun. 15, 2005

(65) Prior Publication Data

US 2006/0045665 A1    Mar. 2, 2006

Related U.S. Application Data

(60) Provisional application No. 60/579,862, filed on Jun. 15, 2004.

(51) Int. Cl.
*B65G 49/07* (2006.01)
(52) U.S. Cl. .................................. 414/217; 414/935
(58) Field of Classification Search ................ 414/217
See application file for complete search history.

(56) References Cited

U.S. PATENT DOCUMENTS

| 6,138,721 | A  | 10/2000 | Bonora et al. | 141/98 |
|---|---|---|---|---|
| 6,220,808 | B1 | 4/2001  | Bonora et al. | 414/217 |
| 6,501,070 | B1 | 12/2002 | Bacchi et al. | 250/239 |
| 6,709,225 | B1 | 3/2004  | Pitts et al.  | 414/787 |
| 6,784,418 | B2 | 8/2004  | Bacchi et al. | 250/239 |
| 6,883,770 | B1 | 4/2005  | Miyajima et al. | 248/544 |
| 7,066,707 | B1 | 6/2006  | Bonora et al. | 414/744.3 |
| 7,100,340 | B2 * | 9/2006 | Bonora et al. | 52/729.5 |
| 7,360,981 | B2 * | 4/2008 | Weaver        | 414/217 |

(Continued)

FOREIGN PATENT DOCUMENTS

WO    WO03/009347    1/2003

(Continued)

*Primary Examiner*—James Keenan
(74) *Attorney, Agent, or Firm*—Perman & Green, LLP; Richard Pickreign

(57) ABSTRACT

A substrate processing apparatus having a frame, a housing, an access system and at least a substrate transport apparatus or a substrate processing device. The housing is connected to the frame. The access system is connected to the frame and forms an access through which substrates are moved in and out of the housing. The substrate transport apparatus or substrate processing device are connected to the frame and are at least partially positioned in the housing. The frame comprises a movable portion. The movable portion is movable relative to the frame so that movement of the movable portion causes separation of the access system and at least one of the substrate transport apparatus or substrate processing device from an installed position. The substrate transport apparatus is selectable from a number of different interchangeable substrate transport apparatus. Each of the different interchangeable substrate transport apparatus has a predetermined reference datum and positioning features for positioning the substrate transport apparatus relative to the frame. The positioning features of each substrate transport apparatus are controllably located relative to its predetermined reference datum to be in a repeatable predetermined location with substantially no variance between the different interchangeable substrate transport apparatus.

10 Claims, 10 Drawing Sheets

U.S. PATENT DOCUMENTS

2003/0044261 A1* 3/2003 Bonora et al. ............ 414/217.1
2003/0091409 A1* 5/2003 Danna et al. ................ 414/217
2006/0104749 A1* 5/2006 Weaver ....................... 414/217
2007/0274810 A1* 11/2007 Holtkamp et al. ........... 414/217

FOREIGN PATENT DOCUMENTS

| WO | WO03/019630 | 3/2003 |
| WO | WO03/021643 | 3/2003 |
| WO | WO03/021645 | 3/2003 |

* cited by examiner

SUBSTRATE PROCESSING APPARATUS WITH REMOVABLE COMPONENT MODULE

CROSS-REFERENCE TO RELATED APPLICATION(S)

This application claims the benefit of U.S. Provisional Application No. 60/579,862 filed Jun. 15, 2004 which is incorporated by reference herein in its entirety.

BACKGROUND

1. Field of the Invention

The present invention relates to substrate processing apparatus and, more particularly, to a substrate processing apparatus with a removable component module.

2. Brief Description of Related Developments

Continuous demand by consumers for ever cheaper electronic devices has maintained pressure on manufacturers of the device to improve efficiency. Indeed, in the current market place, many of the devices, and to a much greater extent the electronic and semiconductor components used in the devices, have become commodities. The desire of manufacturers of electronic and semiconductor device to increase efficiency manifests itself at all levels, but is of special significance in the design, construction, and operation of fabrication facilities or fabs. One unit by which to measure the efficiency of a given fab may be the throughput per unit of area (e.g. throughput per $FT^2$). As may be realized from this unit of measure, the fab efficiency (i.e. higher throughput/$ft^2$) may be increased by any means that raise the production rate per available $ft^2$ of fab space. One means to readily achieve this is by packing as many substrate processing stations as possible in the available fab space. An example of a conventional layout of a substrate processing facility is illustrated in FIG. 1.

The processing stations in the FAB facility 1 may be arranged in any manner, and are shown in FIG. 1 arranged in processing bay matrix arrangement. The FAB processing stations may be of any suitable kind and may include for example substrate processing tools 3, (capable of carrying out any desired semiconductor substrate manufacturing process such as material deposition, etching, baking, cleaning, polishing), stackers 5 (for holding FAB transfer pods, substrate cassettes or substrates), and sorters 4 (for sorting substrates according to desired process recipe in transfer pods or cassettes). The processing facility may also have a FAB material handling system 7 for handling substrates, either in transfer pods (such as front opening unified pods (FOUPs) or standard machine interface (SMIF)), cassettes or individually, between the various processing stations in the FAB 1. The handling system 7 may have intrabay sections 7A-7D connecting processing stations located in the FAB bays, and interbay sections 7E connecting the intrabay sections. As may be realized from FIG. 1, by increasing the density of processing stations in the FAB 1, the FAB is capable of fabricating a greater number of substrates at any one time with a corresponding increase possible in FAB throughput. Naturally, the result of an increase in processing facility density in the FAB is that the processing stations become more compacted together with a commensurate loss in access space to each processing station. The loss of access to the respective processing stations impairs the ease of installation of automation components, such as substrate transport apparatus, aligners, load port modules, into the substrate processing stations. To overcome the installation restrictions due to limited access space, FAB builders have sought more integration of automation components so they may be installed as an automation unit into the respective processing stations. International Publication No. WO03/009347, dated 30 Jan. 2003, discloses an example of a conventional integrated system for workpiece handling for the front end of a processing tool. The conventional system comprises a rigid member, to which front end components including the load port assemblies, pre-aligners, and handling robot are mounted, and which in turn is mounted to the front end of the tool. Another example of a conventional unified spine Structure that environmental front end module (EFEM) components are mounted to is disclosed in International Publication No. WO03/019630, dated 6 Mar. 2003. As evident from the aforementioned examples, conventional integrated automation platforms remain substantially customized to the particular processing stations to which given integrated automation platforms are mounted. As in the case of the installation of separate automation components to a processing station (each component of which is aligned to the unique reference system of the processing station within alignment system accounting for unique variances in component and station), the automation components of the conventional integrated automation platform are aligned to the processing station accounting for variances in the automation components, the integrated platform itself and also the processing station. Hence, the mounting and alignment of the conventional integrated automation platforms to processing stations remains dependent on a number of fabrication variances and each installation is substantially a custom installation. Consequently, conventional integrated automation platforms are not readily swapped between substantially similar processing stations because installation to a different station involves complex and time consuming alignment to the given station. Further, as also evident from the noted examples, the conventional integrated automation platforms are not self standing, using ancillary supports to maintain a stable position for mounting to the processing station. Nor are the conventional integrated automation platforms capable of self or independent transport. Hence, in order to install a conventional integrated automation platform to a processing station dedicated handling equipment is used to support and transport the conventional platform into position and to allow alignment of the automation components to the processing station reference systems. The use of dedicated handling equipment increases the space envelope demand to accomplish installation and removal thereby limiting processing station density in the FAB.

SUMMARY OF THE INVENTION

In accordance with one exemplary embodiment of the present invention, a substrate processing apparatus is provided. The apparatus comprises a frame, a housing, an access system and at least one substrate transport apparatus or substrate processing device. The housing is connected to the frame. The access system is connected to the frame and forms an access through which substrates are moved in and out of the housing. The substrate transport apparatus is connected to the frame for transporting substrates. The substrate processing device is connected to the frame for processing substrates. The substrate transport apparatus or substrate processing device is at least partially positioned in the housing. The frame comprises a movable portion. The movable portion is movable relative to the housing so that movement of the movable portion causes separation of the access system and at least one of the substrate transport apparatus or substrate processing device from an installed position. The substrate transport apparatus is selectable from a number of different interchangeable substrate transport apparatus. Each of the interchangeable substrate transport apparatus has a predetermined reference datum and positioning features for positioning the substrate transport apparatus relative to the frame. The positioning features of each substrate transport apparatus are controllably located relative to its predetermined reference datum to be in a repeatable predetermined location with substantially no variance between the different interchangeable substrate transport apparatus.

BRIEF DESCRIPTION OF THE DRAWINGS

The foregoing aspects and other features of the present invention are explained in the following description, taken in connection with the accompanying drawings, wherein.

DETAILED DESCRIPTION OF THE PREFERRED EMBODIMENT(S)

Figure 2:
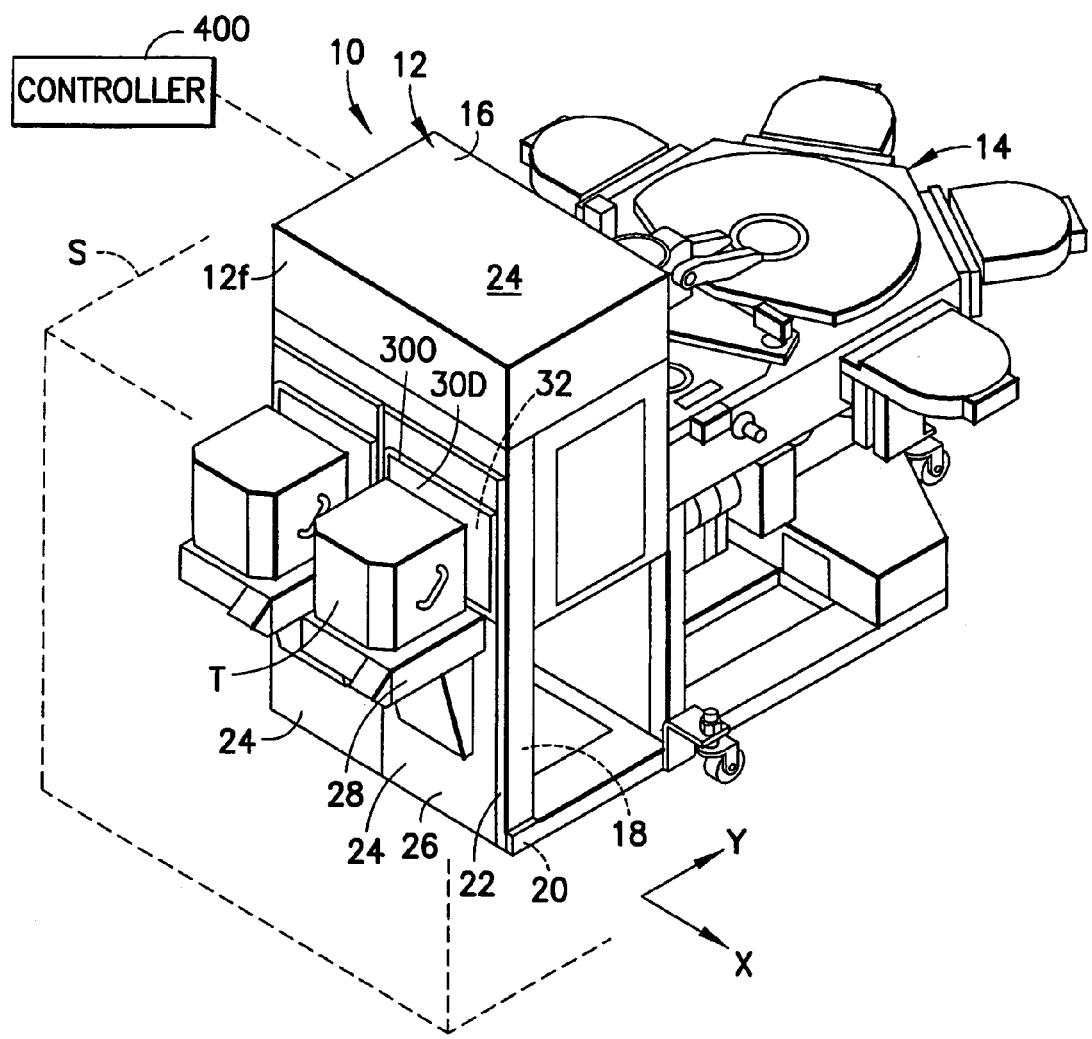
FIGS. 2-2A respectively are perspective views as seen from opposite directions of a substrate processing apparatus, incorporating features of the present invention in accordance with one exemplary embodiment, and zone of separation adjacent the apparatus.

Referring to FIG. 2, a perspective view of a substrate processing system 10 incorporating features of the present invention is illustrated. Although the present invention will be described with reference to the embodiment shown in the drawings, it should be understood that the present invention can be embodied in many alternate forms of embodiments. In addition, any suitable size, shape or type of elements or materials could be used.

Figure 1:
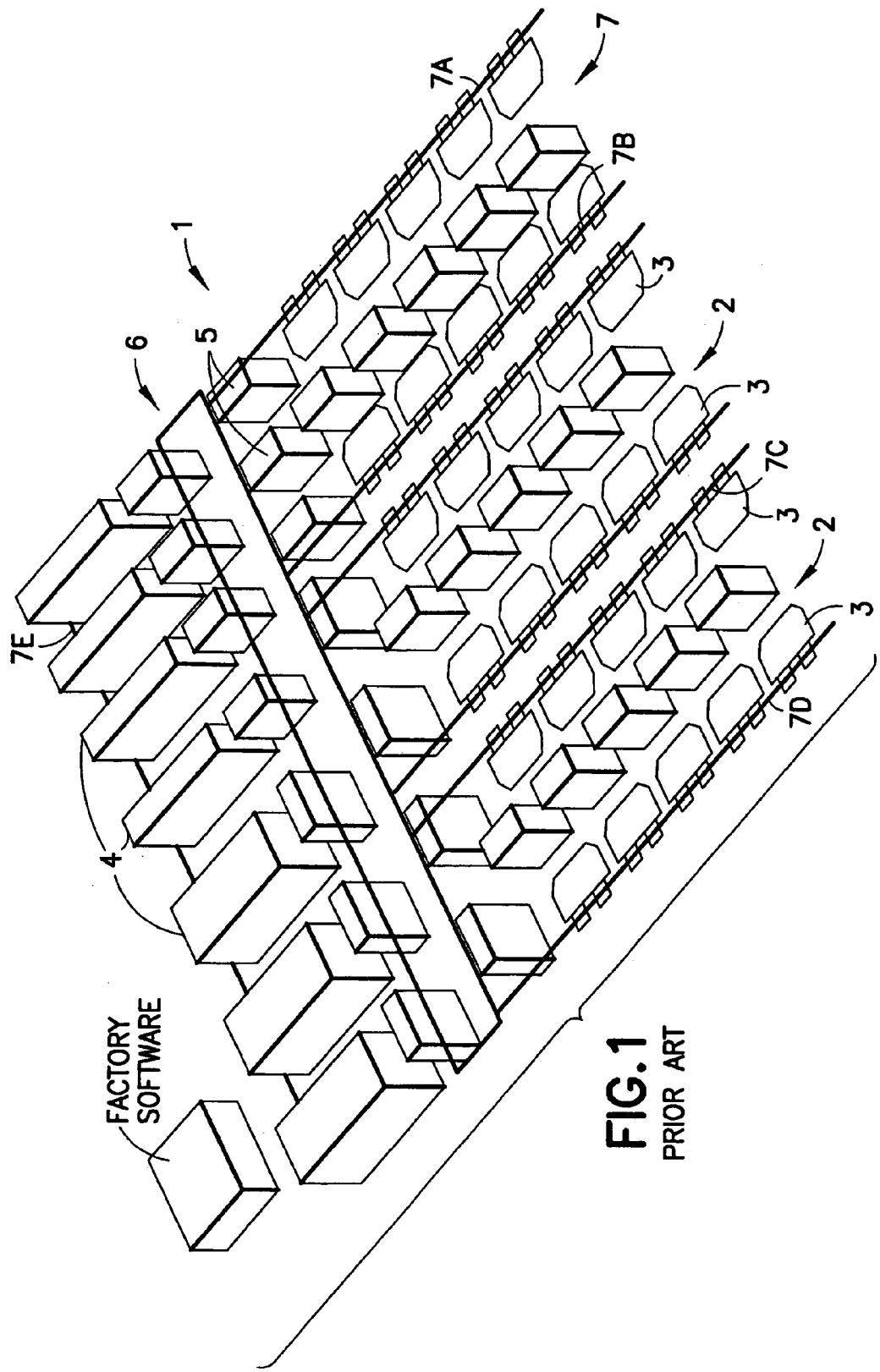
FIG. 1 is a schematic perspective view of a conventional processing facility for processing substrates.
Figure 2A:
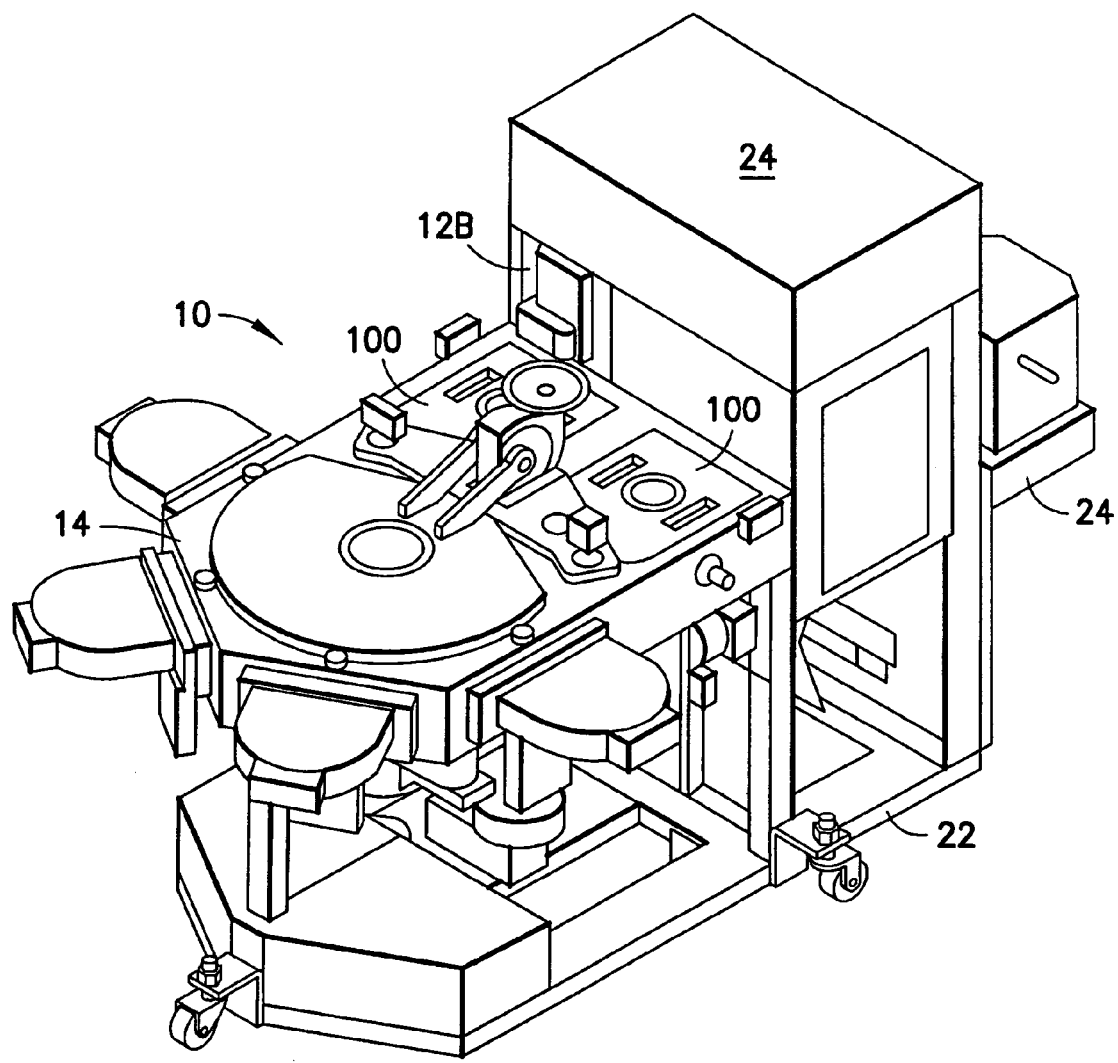

Referring also to FIG. 2A, which provides another perspective view of the substrate processing apparatus 10 as seen from another direction, the apparatus 10 has been shown for example purposes only, as having a general substrate batch processing tool configuration. In alternate embodiments, the substrate processing apparatus may have any other suitable configuration as the features of the present invention, as will be described in greater detail below, are equally applicable to any substrate processing tool configuration including tools for individual substrate processing, stockers, sorters, metrology tools, etc. The apparatus 10 may be capable of handling and processing any desired type of flat panel or substrate such as 200 mm or 300 mm semiconductor wafers, semiconductor packaging substrates (e.g. high density interconnects), semiconductor manufacturing process imaging plates (e.g. masks or reticles), and substrates for flat panel displays. The apparatus 10 may be similar to the work station/processing tools 3 of conventional systems shown in FIG. 1, in that apparatus 10 may be installed (in a manner similar to that shown for conventional tools 3 in FIG. 1) along with other similar or dissimilar substrate apparatus (not shown), in a serial type arrangement in the processing bays (similar to bays 2 in FIG. 1) of a fab. Accordingly, the apparatus 10 may be generally provided with a zone of separation S, allowing operators access to a desired region of the apparatus 10, and may have some regions around the perimeter with limited or no access. The apparatus 10 may generally comprise a front section 12 and a rear section 14. The front section 12 (the term front is used here for convenience to identify an exemplary frame of reference, and in alternate embodiments the front of the apparatus may be established on any desired side of the apparatus). The front section 12 has a system (as will be described in greater detail below) providing an interface allowing the importation of substrates from the fab into the interior of the apparatus 10. The front section 12 also generally has a housing 16 and automation components located in the housing handling substrates between the rear section 14 and the front section interface to the exterior. The rear section 14 is connected to the housing 16 of the front section. The rear section 14 of the apparatus comprises a processing system (as will be described in greater detail below) for performing desired processes to substrates within the apparatus. The front section 12 has a module portion 18 capable of being moved relative to the rest of the front section and apparatus from an installed or closed position (shown in FIG. 2) into the zone of separation (see also FIG. 3). The automation components are connected to the movable portion 18 and are moved at least partially out of housing from their installed position in the front section, when the movable portion is moved into the zone of separation, thereby allowing easy unencumbered access to the automation components for service, removal and replacement. The movable portion includes a transport system 20 allowing the movable portion to move freely, and a standard mounting interface ensuring repeatable mating with the fixed portion of the front section when moved to the closed position to desired tolerance standards.

Still referring to FIGS. 2-2A, the zone of separation S is shown for example purposes as being located at the front face 12F of the apparatus 10. In alternate embodiments, the zone of separation may be located at any other desired side of the apparatus. The zone of separation may coincide with the space envelope region in the fab processing bays used by the material handling system (similar for example to AHMS system 7 in FIG. 1) to transport substrates between processing stations. In any event the zone of separation S separates the apparatus 10 from adjoining apparatus or from walls, bulkheads, partitions subdividing the fab. The zone of separation S has been representatively depicted in FIGS. 2-2A as having a generic hexahedron shaped boundaries, but may have any other suitable bounds generally complementing the exterior shape of the movable portion 18 of the front section as will be evident further below.

As has been noted before, the substrate processing apparatus 10 in this embodiment is configured for batch processing. The rear section 14 may be any desired type of substrate processing apparatus or tool. A suitable example of a batch processing apparatus is the Brooks Automation Gemini Express™ Bridge Cluster Tool Platform. The term processing tool is used for convenience and encompasses any desired device capable of operating in some manner with substrates including for example sorters, metrology tools, stackers and so on. In alternate embodiments, the substrate processing apparatus capable of batch processing may have any other desired configuration. In still other alternate embodiments, the processing apparatus may have a configuration for individual processing. As may be realized, and as will be described in greater detail below, the process tool forming the rear section 14 of apparatus 10 interacts or interfaces in some manner with substrates transported thereto and hence it is desired that substrates carried therein be aligned to correspond to the expected interaction/interface of the rear section 14.

The front section 12 of the apparatus 10, generally comprises a support frame 22 and housing 24 in this exemplary embodiment. The housing is mounted to the support frame 27. The housing 24 in this embodiment is arranged to form a mini environment therein. Accordingly, though the interior of the housing may be open to ambient atmosphere suitable seals and particulate controls may be incorporated into the housing 24 and outer joints to frame 22 and other interfacing components to facilitate establishment of a mini environment within the housing. In the exemplary embodiment shown in FIG. 2, load ports 25 are mounted to the frame/housing of the front section 12. The load ports 25 are shown as being located at the front face of the apparatus, wherein the load ports may be readily accessed by the material handling system (similar to material handling system 7 shown in FIG. 1) servicing the apparatus 10. In this embodiment, there are two load ports 25, but in alternate embodiments the front section of the apparatus may have a fewer or larger number of load ports connected to the housing of the front section. The frame/housing of the front section my have a BOLTS type interface (not shown) for securing the load ports 25 to the front section. Load ports 25 are shown as being similar, though in alternate embodiments load ports of different types may be used. Each load port 25 generally comprises a load port frame 26, with a substrate transport container holding area 28. The load port frame may be configured as desired to form a closure for the housing face to which the load port is mounted. The load port frame 28 may include a suitable mounting system for mounting/attaching the load port 25 to the frame/housing of the front section. An example of a suitable mounting system for connecting the load port 25 to the frame/housing of the front section is disclosed in U.S. patent application Ser. No. 09/600,879, filed Aug. 14, 2000, incorporated by reference herein in its entirety. The load port frame 28, defines a port of opening 30O through which substrates may be moved in and out of the front section housing 24 from substrate transport containers T on the load port. The opening 30O can be closed by a door 30D in this embodiment to maintain the mini environment conditions in the housing. The door 30D may be opened and closed by any actuator suitable mechanisms 32. An example of a suitable load port door and door actuator mechanism is disclosed in U.S. Pat. No. 5,772,386, issued Jun. 30, 1998, incorporated by reference herein in its entirety. The door 30D and actuation mechanism may be operably connected to a controller 400 to control opening and closing of the door. The controller 400 may also be connected to an environmental control system (not shown) to maintain the mini environment in the front section 12.

The substrate transport holding area 28 in this exemplary embodiment is configured for holding a transport container T such as a front opening uniform pod (FOUP). In the embodiment shown the holding area 28 is capable of holding one transport container, though in alternate embodiments, the area may include one or more buffering stations for simultaneously supporting more than one container T. In this embodiment, the holding area 28 has suitable container supports holding the container T in a suitable attitude to interface the container T with the opening 30O in the load port, or otherwise allow transport of substrates between the container T and housing 24 through the opening 30O. In this embodiment, the holding area 28 may include a shuttle (not shown) capable of moving the container T into sealed contact with the rim of the opening 30O. An example of a suitable load port transport container holding area is disclosed in U.S. patent application Ser. No. 10/623,970, filed Jul. 21, 2003, incorporated by reference herein in its entirety. In alternate embodiments the load port holding area may be configured to hold any desired type of substrate transport container such as a standard mechanical interface (SMIF) pod or any other desired substrate holding pod or cassette. In these embodiments, the port in the load port for accessing the substrates or cassette held in the pod, is situated appropriately to allow the substrates to be moved between the pod in the load port holding area and the interior of the housing.

Figure 3:
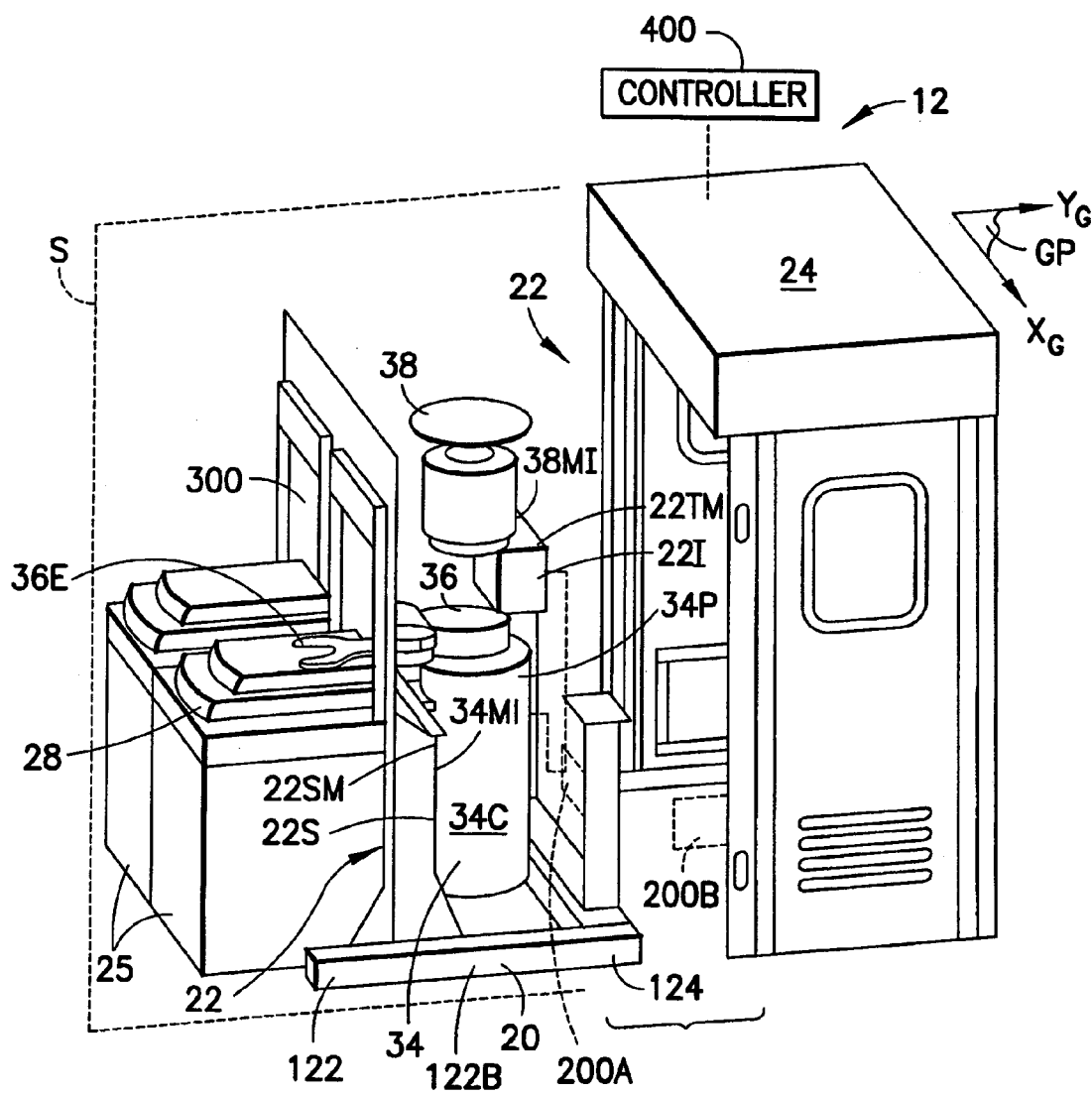
FIG. 3 is a perspective view of a portion of the processing apparatus in FIG. 2 showing a removable section of the apparatus in a removed position.
Figure 4:
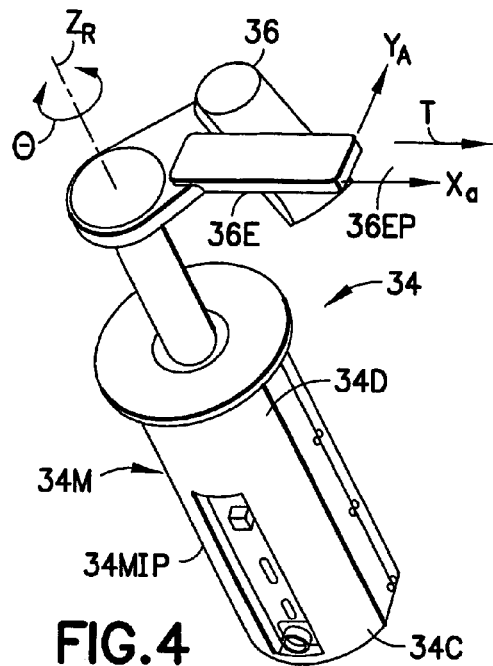
FIG. 4 is a perspective view of a representative automation component of the processing apparatus in FIG. 3.

Referring now also to FIG. 3, showing another perspective view of the front section 12 of the apparatus 10 with a movable portion 18 of the front section in a displaced position (relative to an installed position of movable portion described below). The front section 12 generally includes various automation components located inside the housing 24. In the embodiment shown, the front section 12 has for example, a substrate transport apparatus 34 and an aligner 38. In alternate embodiments, the front section may have fewer or more components including a traverser, buffer station, metrology station or any other desired automation components. The substrate transport apparatus 34 generally comprises a drive section 34D operating a mobile transport structure 36 with an end effector 36E capable of holding one or more substrates thereon (one end effector is shown in FIG. 3 for example purposes). In the embodiment shown (see also FIG. 4), the mobile transport structure has a scara arm type configuration for example purposes. In alternate embodiments any suitable type of substrate transport apparatus may be used such as a "frog leg" articulated link robot arm, or liner slide transport arm. The arm 36 is mounted to the drive section 34D to articulate the arm (θ and T motion) and move the end effector 36E as desired in order to effect transfer of substrates between the substrate container on the holding area 28 (see FIG. 2) and any desired position inside housing 24 or one of the rear section 14 load/unload stations, for example load locks 100 at the back of the housing 24 (see FIG. 2A). In FIG. 3, the end effector 36E is shown extended to the position for picking/ placing substrates inside a transport container (not shown in FIG. 3) on holding area 28. Drive section 34D includes suitable drives with cutout shafts coaxial or parallel to arm axis of rotation Zr) for providing at least two independent axis of freedom motion to the mobile structure (e.g. θ rotation and T extension/retraction action), and may have a Z drive for raising and lowering the arm or end effector 36E in the vertical direction. A suitable example of a scara arm and drive section for the substrate transport apparatus is disclosed in U.S. Pat. No. 6,485,250, issued Nov. 26, 2002, incorporated by reference herein. In alternate embodiments, the substrate transport apparatus 34 may have any other desired configuration capable of holding and transporting end effectors from holding area of the load port to a desired destination in the housing. As may be realized, the θ and T motion of the arm are in a substrate transport plane defined by the axis of rotation Zr that is normal to the substrate transport plane. The substrate is held by the end effector 36E during transport and it is desired that the transported substrate be substantially parallel to the transport plane. Accordingly, it is desired that the end effector have a substrate holding plane 36EP (i.e. the plane in which the end effector holds the substrate that is coplanar with the transport plane). Thus, the substrate holding plane 36EP, defined by the substrate contact pads and grips holding the substrate on the end effector is established substantially orthogonal to the rotation axis Zr.

The transport apparatus 34 may be mounted to the frame/housing of the front section so that the transport apparatus 34 is carried by the frame/housing of the front section. For example, the transport apparatus 34 may be mounted by having a casing 34C of the drive section 34D directly mounted to either the frame 22, or the housing 24. In the exemplary embodiment shown in FIG. 4, the transport apparatus casing 34L, may be provided with a mounting interface 34M that may mount the transport apparatus 34 to the frame of the front section. In alternate embodiments, the mount interface may be located on any other desired portion of the transport apparatus. The mount interface 34M has both mechanical attachment features as well as positioning features that both attach and position the transport apparatus to the frame of the front section of the processing apparatus. For example, the mount interface may have any desired number and pattern of fastener holes (not shown) and/or seating surface, formed by structure depending from casing 34C, that serves to both position and attain the transport apparatus to the processing apparatus frame. The features of the mount interface 34M in effect define a mount interface plane 34MIP to which the conjugate mounts on the process apparatus frame interface when the transport apparatus 34 is mounted to the frame.

Figure 5:
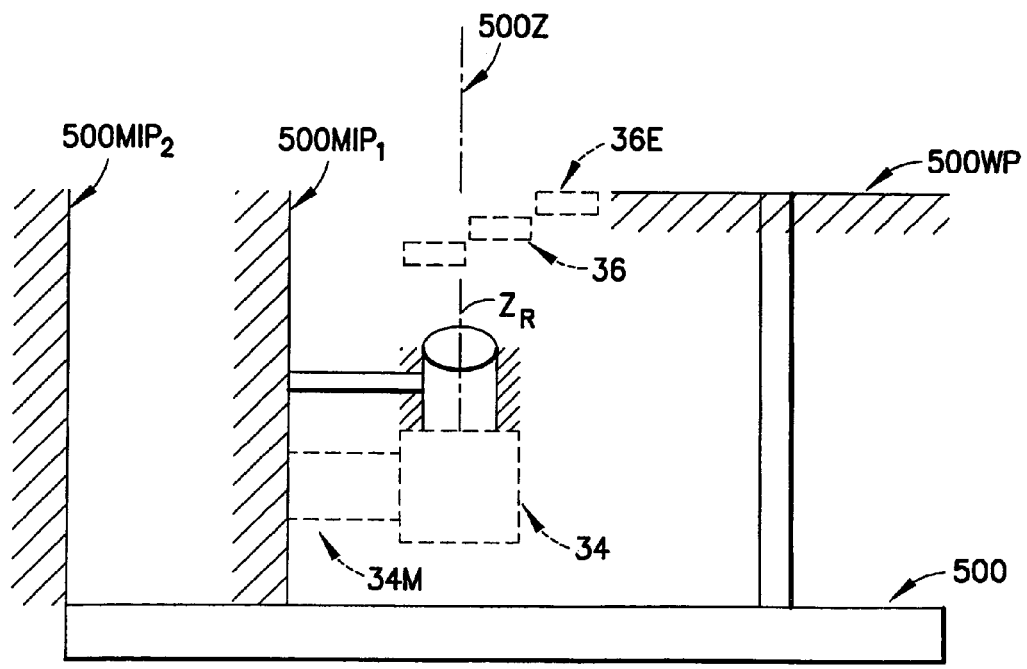
FIG. 5 is a schematic view of a fixture tool used for alignment of the automation component in FIG. 4.

In accordance with this exemplary embodiment, the mount interface 34M and hence the mount interface plane 34MIP defined thereby, are located in a known controlled relation to the axis of rotation Zr of the transport apparatus arm 36 and the substrate holding plane 36EP of the end effector. The mount interface 34MI, and mount interface plane is located in a known controlled manner to the substrate transport plane provided by the transport apparatus. Accordingly, the mount interface 34MI and mount interface plane 34MIP is in a repeatable location for each and every similar interchangeable transport apparatus to the extent that there is no substantial or meaningful variation in the locations of the mount interface (with respect to the aforementioned reference datums) between different interchangeable transport apparatus (similar to apparatus 34). Referring now to FIG. 5, there is shown a schematic elevation view of an exemplary positioning fixture tool 500 used in accordance with the exemplary embodiment to establish the repeatable location of the mount interface 34MI and mount interface plane 34MIP of transport apparatus similar to apparatus 34 in FIG. 4. In alternate embodiments, the repeatable location of the mount interface may be established using any other suitable position and alignment determination system such as using lasers. As seen in FIG. 5, the fixture tool 500 has desired position reference datums 500WP, 500 Z and positioning references 500MIP1, 500MIP2 in fixed and known relation to the reference datums 500WP, 500Z. Though in the embodiment shown in FIG. 5, the reference datums 500WP, 500Z are shown as being defined by physical surfaces (e.g. a planar surface 500WP, or hollow cylinder 500Z), in alternate embodiments the reference datums similar to datums 500WP, 500Z may be established/formed using any other suitable means such as electro-optical means, for example lasers. Similarly, the positioning references 500MP1, 500 MIP2 may be physical surfaces (such as a plane surface or a group of geometric features defining a plane surface) or may be established using other suitable means such as electro-optically. In this embodiment, for example purposes, the transport apparatus 34 (shown in phantom in FIG. 5) may be positioned on the tool fixture 500 so that the reference datum 500WP is coincident with the substrate holding plane 36EP (see also FIG. 4) provided by the end effector 365. A dummy device (not shown), such as a modified substrate may be used (i.e. held by the end effector in the same manner as a substrate) to aid in defining the end effector substrate holding plane and its coincidence with fixture reference datum 500WP. Similarly, the transport apparatus 34 is positioned so that the arm rotation axis (Zr see FIG. 4) is substantially coincident with reference datum 500Z of the tool fixture. This may serve as a further check as to orthogonality of the transport arm 36 rotation axis to end effector substrate holding plane 36EP. With the orthogonality constraint satisfied, the transport apparatus mount interface 34M is adjusted or formed so that the mount interface plane 34MIP is coincident with the desired positioning reference 500 MIP1 of the fixture tool. As may be realized, the positioning references 500 MIP1, 500MIP2 of the fixture tool 500 may be defined in any desired position and attitude (within consideration of the general dimensions and arrangement of the front section 12 of apparatus 10) relative to the reference datums 500WP, 500Z to suit the design configuration of the mount interface. The mount interface for each interchangeable transport apparatus may be set thus, thereby ensuring a repeatable location of the mount interface relative to the substrate transport plane of each transport apparatus. Although in this exemplary embodiment it has been the substrate transport plane and axis of rotation of the transport apparatus that have been used, for example purposes, to define the reference datums of the positioning fixture tool 500, in alternate embodiments, any desired controlled surface, axis, plane or feature of the transport apparatus may be used for the reference datums of the positioning fixture with respect to which the transport apparatus mount interface are repeatably established.

In alternate embodiments, the drive section 34 may be mounted on a traverse table or traverser or car (not shown), such as for example disclosed in U.S. Pat. No. 6,139,245, incorporated by reference herein in its entirety, seated on tracks or rails (not shown) so that the transport apparatus may be capable of traversing laterally. In the case a traverser mounts the apparatus 34 to the frame/housing, the rails/tracks are mounted to the frame/housing structure, and the traverser table with apparatus 34 is seated on the rails. The positioning fixture tool 500 may have a positioning reference (for example, positioning reference $500MIP_2$, see FIG. 5) for establishing a repeatable location of the mounting interface of each transfer to the extent that there is substantially no variance between the mounting interface locations of different interchangeable traversers in a manner similar to that of interchangeable transport apparatus. Locating the mount interface of the traverser may be accomplished similarly to the transport apparatus mount interface 34M described above. For example, the traverser may be positioned on the fixture tool 500. The traverser carriage and transport apparatus, or alternative fixtures (not shown) with the positional attributes representative of the carriage and transport apparatus (e.g. axis of rotation, wafer holding plane), may be mounted to the traverser. The traverser is positioned so that the positional references align with the reference datums on the fixture tool (e.g. axis of rotation Zr (see FIG. 4) or a positional reference such as a scribe line, (representative of the axis of rotation) is coincident with reference datum 500Z. When the traverser position satisfies the constraints formed by the reference datums of the fixture tool, the traverser mount interface is adjusted or formed to coincide with the corresponding positioning reference $500MIP_2$ of the tool. In alternate embodiments, the fixture tool may have dedicated reference datums for defining the positional constraints of the traverser. For example the positioning reference $500MIP_1$ for positioning the transport apparatus mount interface 34M, may be used as the reference datum for establishing the position of the traverser.

As noted above and seen also in FIG. 3, the frame 22 of the front section has structure 22S, disposed in any desired configuration, for example to avoid interference with the substrate transport apparatus in its complete range of motion, providing mounting facets/surfaces for attachment of the transport apparatus to the frame structure. The mounting facets, surfaces and structure for attachment of the transport apparatus 34, and/or traverser to the frame 22 are generally conjugal to the transport apparatus mounting interface 34M or the traverser mounting interface. The placement of the mounting surfaces on the frame will be described further below. As may be realized from FIG. 3, the substrate transport apparatus 34 is communicably connected by suitable transmission means to the controller 400, as well as a power supply. For example, the transport apparatus may be hard wired or may be connected by a combination of hard wiring and wireless transmission for both power and command signals.

As seen in FIG. 3, the front section 12 in this embodiment may include an aligner 38 located inside housing 24 for positioning substrates to a predetermined orientation. The aligner 38 may have any suitable configuration. The aligner 38 may be located to be within the reach of the end effector 36E on the substrate transport apparatus 34. Accordingly, the substrate transport apparatus 34 is capable of moving substrates from the transport containers T on the load ports, to the aligner 38 and/or to other destinations within the housing 24. Similar to the transport apparatus 34 and traverser described above, the aligner 38 is also configured to be interchangeable amongst other similar interchangeable aligners. Thus, each aligner 38 from the interchangeable aligners has a mounting interface 38MI, that provides attachment means to conjugal supports 22T (see FIG. 3) on frame 22, which is repeatably located so that, similar to the transport apparatus 34 and traverser, there is no substantial variance between different aligners. Fixture tool 500 may be used to repeatably locate the aligner mounting interface in a manner generally similar to that described before with respect to the repeatable positioning of the transport apparatus mount interface 34MI or traverser mount interface. Fixture tool 500 is representatively depicted in FIG. 5 as one fixture, but may comprise one or more fixture tools. For example fixture tool 500 may include dedicated fixtures for each automation component. In any event, fixture tool 500 may have a reference datum(s) similar to reference datum 500WP corresponding to a desired positional references) of the aligner (e.g. wafer holding plane of the aligner) and has positioning reference(s) similar to reference $500MIP_1$, $500MIP_2$ establishing the repeatable location of the aligner mounts. In alternate embodiments reference datum 500WP of the fixture may be used. The aligner 38 may be positioned so that its positional reference(s) satisfy the positional constraints defined by the reference datum(s) of the fixture tool. With the aligner positional constraints satisfied, the aligner mount interface 38MI (see FIG. 3) is adjusted or formed to coincide with the corresponding positioning reference(s) of the fixture tool. The aligner 38 may be mounted to the frame 22 of the front section 12, so that it is carried by the frame. The frame has suitable support structure 22T providing mounting features for mounting/attaching the aligner to the frame. The support structure 22T may be located and configured as desired to conform with the mounting arrangement of the aligner, and placement of the aligner inside the housing 24 as will be described further below. The aligner 24 may be connected by suitable means, such as hard wiring or wireless transmission means to the controller 400 and a suitable power supply (not shown). The front section may include other automation components such as buffers (not shown), metrology modules (not shown) and any other desired substrate processing components (not shown) located in the housing 24. Each of the automation components may have its mounting interface repeatably located in a manner similar to that described before for the transport apparatus, traverser and aligner, so that the mounting interface location variance between any desired interchangeable automation components in housing 24 is negligible. Accordingly, as will become more evident below, any desired automation component in the housing may be swapped with another similar interchangeable component without readjustment of the component mounting interface.

As seen best in FIG. 2A, the housing 24 is connected at the back face 12B to the rear section 14 of the apparatus. As noted before, the rear section 14 may be atmospherically controlled or isolated (e.g. vacuum, inert atmosphere). Accordingly, load locks 100 may be provided to interface between mini environment inside the housing 24 and the controllable or isolatable atmosphere in the rest of the rear section 14. The housing 24 thus may include openings/apertures, through which the substrates may be transported between the housing and load locks 100, that may be closed by slot valves or doors to isolate the rear section 14 from the front section. The rear section 14 may also include a transfer chamber and a number of processing modules (e.g. material reposition, etching, heating) to perform a desired process to the substrates. As noted before, in alternate embodiments the rear section of the apparatus may be a stocker, sorter, metrology tool or any other desired device. Frame 22 supporting the housing 24 of the front section, may be attached to the frame of the rear section. This provides structural integrity to the apparatus 10 during seismic conditions, and provides rigidity to avoid unwanted differential displacements between different parts of the apparatus 10 that may impact the close positional tolerances used for setting up the automation components within the processing apparatus. Frame 22 may hold the housing 24, and in particular the back face 12B of the housing fixed relative to the rear section of the apparatus.

Figure 7:
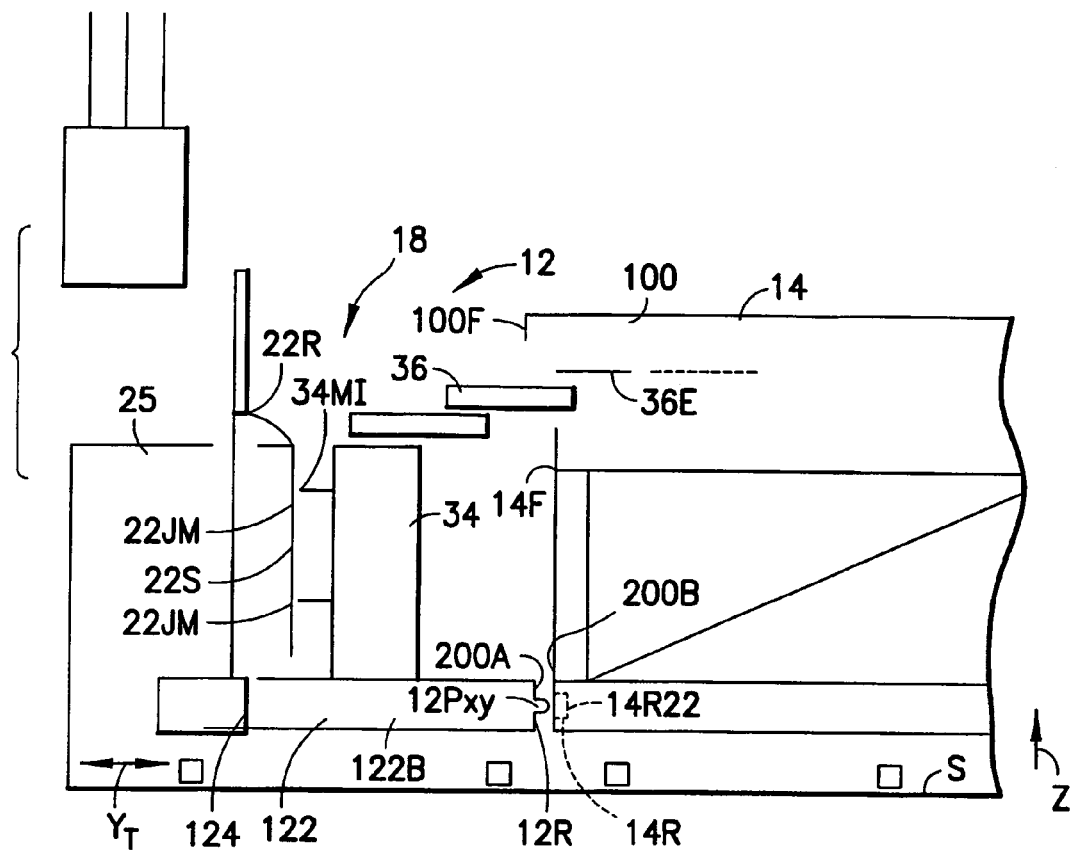
FIG. 7 is a schematic elevation view of the processing tool and movable portion of the apparatus in another removed position that is proximate to the installed position of the movable portion in the apparatus.
Figure 9:
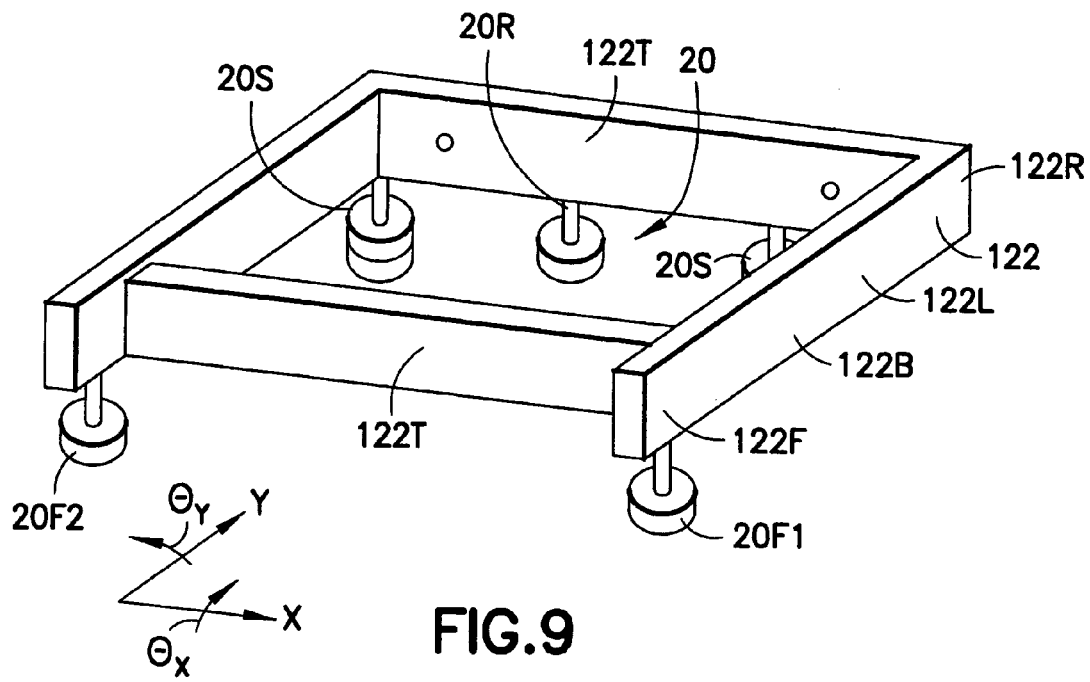
FIG. 9 is another schematic partial perspective view of another section of the movable portion in FIG. 3 showing still another portion of the alignment system.

As seen in FIG. 3, in this embodiment the front section 12 of the apparatus has a movable portion 18, that may be removed to access the automation components (e.g. interior portions of load ports 25, transport apparatus 34, aligner 38) inside housing 24. Unlike conventional apparatus however, the movable portion 18 is not merely removable access covers on the housing (though one or more access covers may be provided), but a movable portion that allows for the separation of the automation components, on their mountings, from the remainder of the front section 12. The movable portion 18 is shown in the removed position in FIG. 3. In this exemplary embodiment, the movable portion 18 includes subframe 122, that may be made from metal or plastic or other suitable structural material (e.g. composites). The term subframe means any suitable type of support structure whether a skeletal type frame, or monocoque structure or a combination thereof. Subframe 122 may be part of frame 22 of the front section when the movable portion is in the installed position. In the embodiment shown, the subframe 122 of movable section 18 includes the mounting attachments 22S, 22T supporting the substrate transport apparatus 34 and aligner 38. The subframe 122 in the embodiment includes the interface 22R for the load ports 25. In alternate embodiments, the subframe of the movable portion may include support structure for carrying any other automation components. Referring also to FIGS. 7 and 9 there is shown respectively a schematic elevation view of the movable section 18, of the front section 12, in another position proximate to an installed or mated position of the movable section, and a partial perspective view of a portion of the movable section. As may be realized from FIGS. 3, 7 and 9 the subframe 122 of the movable section may be configured so that the movable section 18, with an automation component thereon, is self supporting and self standing in a stable attitude both when in the removed position shown in FIG. 3 and in the installed position (substantially similar to the position of the movable section shown in FIG. 7). As noted above, in the installed position, the movable section subframe 122 may be integrally attached to the frame 22 of the front section so that frame 22 and subframe 122 define an integral frame system. In alternate embodiments, the frame 22 of the front section and the subframe 122 of the movable section may be structurally independent of each other when the movable section is in the installed position. As seen in FIGS. 3, 7 and 9, in this embodiment the subframe 122 has a general skeletal frame arrangement, though (as noted before) in alternate embodiments, the movable section subframe may have any suitable configuration such as a monocoque configuration. The subframe 122 may be provided with a base section 122B (see FIG. 9) to which other portions of the frame are connected. In this exemplary embodiment, base section 122B has a general box shape framed by longitudinal 122L and transverse 122T base frame members. FIG. 9 illustrates only representative frame members for example purposes and the base may have more or fewer transverse or longitudinal members, and may have any other desired structural members such as stiffening gussets, cross brace members and so on. In alternate embodiments the base section of the movable section subframe may have any suitable shape. In other alternate embodiments, the subframe may not be provided with a base section. The base section 122B may provide the subframe 122 with the desired rigidity so that differential displacement between the automation components 34, 38 mounted to the subframe are acceptable under static and dynamic loads generated during operating and seismic conditions. The structural members 122L, 122F may be fabricated individually and joined together by mechanical, chemical or metallurgical means. In alternate embodiments, the base section or portions thereof may be of unitary construction formed by suitable manufacturing processes such as forging. As seen in FIG. 3, the automation component(s) mounting structure 22S, 22T of the subframe is dependent from the subframe base 122B. The automation component(s) mounting structure 22S, 22T may be formed in any manner, of any suitable structural members, that satisfy the space envelope constraints of the movable section and clearance envelope constraints of the automation components. The mounting structure 22S, 22T, which is representatively shown in FIGS. 3 and 7, is of sufficient strength and rigidity to support static dynamic loads from the automation components under seismic and operating conditions. The mounting structure 22S, 22T has respective mounting interfaces 22SM, 22TM that interface with the corresponding mount interface 34MI, 38MI of the automation components. The mount interface 22SM, 22TM on the mounting structure 22S, 22T are adjusted to repeatably locate the automation components as will be described further below. As shown in FIGS. 3 and 7, the subframe 122 of the movable section 18 also has mounting structure 22R for mounting the load port modules 25. Similar to automation component mounting structure 22S, 22T, the mounting structure 22R for the load ports also depends from the subframe base 122B. The load port mounting structure 22R may be formed of any structural shape allowing the load ports to be mounted thereto, and is sufficiently strong and rigid to prevent undesired differential displacement between the transport container holding area 28 of the load ports 25 and the other automation components mounted on the movable section 18.

The movable portion 18 has an integral transport system 124 allowing the movable portion 18 to be moved freely (in the direction indicated by arrow YT in FIG. 7) between the installed position (shown in FIG. 2) and the removed position (shown in FIG. 3). The transport system 124 of the movable portion may be an independent system (e.g. rollers, cassettes, wheels, skids) movably supporting the subframe 122 from structure (e.g., fab, floor, fab structure) independent of the other portions of the front section. Accordingly, the movable portion 18 may have an integral adjustment system 20 to set and maintain a desired positional reference (within desired tolerances) between the automation components on the movable section and the non-movable portion of the apparatus 10, in particular of rear section 14) when the movable section 18 is moved to the installed position. For example, between the substrate transport apparatus 34 and ports for load locks 100 (see FIG. 2A) in the front face 14F of the rear section 14 (see also FIG. 6). A suitable position reference system (for positioning along x, y, z axes as well as rotational alignment about x, y axes) may be included in the front section, as will be described, to ensure precise positioning of the movable portion 18 with respect to the rest of the tool. This position reference system for the movable portion 18, that may incorporate mechanical, electromechanical, or electro optical target and target engagement or recognition systems, may be included in a standard mounting interface 200A, 200B of the movable section 18 and the rest of the tool. As may be seen in FIG. 3, the mounting interface may include conjugal portions 200A, 200B (construction may be mechanical, electrical, or optical means) respectively mounted on the movable portion 18 and the fixed portion of the tool as will be described below. The positioning system may further serve as a basis for positioning the automation components with respect to the movable section 18 as will also be described below. It is significant to note that the automation components (i.e. the load ports 25, substrate transport apparatus 34 and aligner 38) carried by the movable portion 18 may move together, in this embodiment as a unit, automation engine when the movable portion 18 is moved into the zone of separation S. Accordingly, relative motion between the components that may effect alignment between the components may be minimized. In alternate embodiments, the support structure carrying the automation components, such as supports 22S carrying substrate transport apparatus 10 or supports 22T carrying the aligner 38, may incorporate movable structure such as slides, rails, tracks, allowing the automation components to be moved relative to the subframe 122 for improved accessing when the movable portion 18 is moved into the separation zone S. For example, after moving the movable portion 18 from the installed position into the separation zone S, the substrate transport apparatus, or aligner may be moved/slid out (e.g. laterally) while still on its mountings from the subframe of the movable portion.

As noted before, the processing apparatus 10 includes a positioning system 200 for repeatably positioning the automation engine of the movable portion 18 to the rest of the tool. As shown in FIG. 3, the positioning system 200 has conjugal, or otherwise interfacing portions 200A, 200B respectively on the movable section 18 and the other (non-movable/rear section) of the apparatus. Mounting interface portion 200B defines the positioning reference basis/datum on the apparatus 10, and mating portion 200A on the movable section interfaces with the portion 200B to locate the automation engine. The automation engine, by virtue of the location of the automation components 34, 38, which will be described in greater detail below, is positioned so that upon interfacing of portion 200A, 200B of the positioning system, when the movable section is brought to its installed portion, the automation engine is in a repeatable location independent of variances in the structure of the movable section 18. In other words, the automation components on the movable section 18, and hence the automation engine defined thereby, are positioned based upon positioning system 200, and independent of the structure of the movable section. This provides true interchangeability of the automation engines between different processing apparatus similar to apparatus 10 without regard to dimensional variances in the structure of the movable sections themselves.

Figure 6:
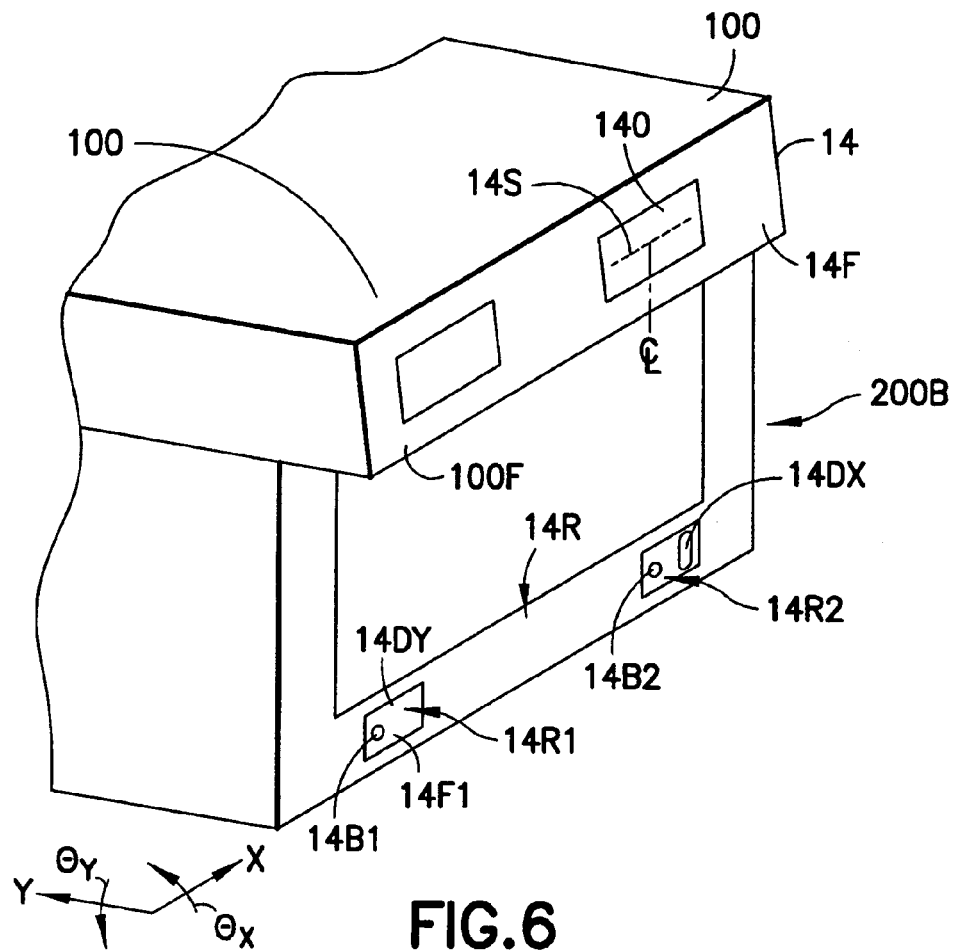
FIG. 6 is a schematic partial perspective view of a processing tool of the processing apparatus in FIG. 2A.

Referring now to FIG. 6, there is shown a front face 14F of the rear section 14 of the apparatus 10. The front face 14F has the mounting interface portion 200B located thereon. In this exemplary embodiment, the front face 14F of the rear section 14 has been established for example purposes at the mating face of the processing tool (for example the mating interface of load locks 100, see FIG. 2A). In alternate embodiments, the front face of the rear section, or the reference face with the reference datum for locating the automation engine relative to the apparatus, may be established as desired on the rear section or non-movable portion of the front section of the apparatus. Mounting interface portion 200B includes reference datum 14R. Mounting interface portion 200B may also generally include mechanical and other interfaces or couplings (e.g. communication or power system couplings) for connecting the movable section 18, when in the installed position, to the non-movable portion of the tool 10 as noted above, and as will also be further described below. As may be realized, the reference datum 14R defines the position constraints for locating the automation engine on the movable section 18 to the rest of the tool when the movable section is brought to its installed position. In the exemplary embodiment shown in FIG. 6, reference datum 14R has Y and X reference datums 14R$_1$, 14R$_2$ respectively establishing Y and X constraints 14DY, 14DX. In alternate embodiments the reference datum on the non-movable portion of the apparatus may define more or fewer position constraints. The reference datums 14R$_1$, 14R$_2$, and hence the position constraints 14DY, 14DX defined thereby, may be located in a known relation to desired references of the apparatus. By way of example, the Y reference 14R$_1$ may be placed at a known distance from the front face 100F of the slot valve for load lock 100. This may be an appropriate reference of the apparatus 10 in relation to which the positioning Y reference 14R$_1$ may be located because it is an interface that exists between the automation engine (in particular the transport apparatus 34) and the other portions of the apparatus 10.

The interface may be a control interface and is independent of the dimensional variances between different apparatus similar to apparatus 10 generated during fabrication. In alternate embodiments any other desired reference of the apparatus may be used for locating the Y position reference 14R$_1$. The X reference 14R$_2$, may be placed at a known distance from for example a center line CL of the slot valve for load lock 100, (another independent reference) though any other desired X reference may be used. The Y and X references 14R$_1$, 14R$_2$ may be repeatedly located, at the known distance from the desired apparatus references, for each apparatus similar to apparatus 10 by using a fixture tool or other precision locating systems such as an optical or electro-optical locating system. Accordingly, the Y and X references, similar to references 14R$_1$, 14R$_2$, of each apparatus, similar to apparatus 10, are located with respect to common references of the apparatus at a repeatable location with substantially no variance between locations on different apparatus. Thus, the Y constraint 14DY defined by Y reference 14R$_1$ is substantially in the same known location, with respect to its locating reference, for each apparatus similar to apparatus 10. This is similar for the X constraint 14DX.

Figure 6A:
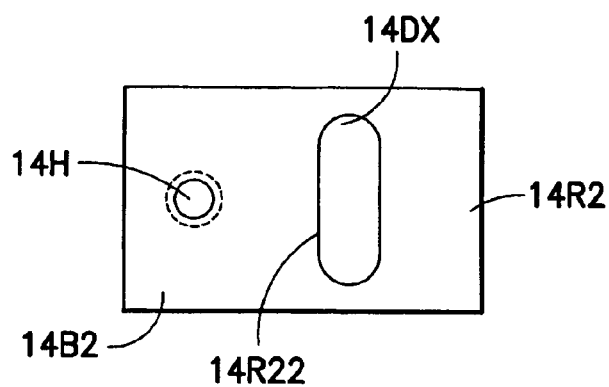
FIG. 6A is an elevation view of an alignment datum on the processing tool in FIG. 6 that is part of an alignment system for alignment of the movable portion to the processing apparatus.

As seen in FIG. 6, in this exemplary embodiment the Y and X reference datums 14R$_1$, 14R$_2$ (and the Y and X position constraints defined thereby) are formed by plates 14B1, 14B2. Plates 14B1, 14B2 may be generally similar. Plate 14B1 that forms the Y reference datum 14R1 has a front face 14F1 that is substantially flat, which may be formed by machining or other suitable process. In this exemplary embodiment it is the front flat face 14F1 of plate 14B1 that defines the Y constraint 14DY. The plate 14B1 is located (as described above) so that its front face 14F1 is at the known location and is mounted to front face 14F by any suitable means, such as mechanical fastening, brazing, welding or bonding, that maintain the front face in the known location. When mounted, the front face is substantially perpendicular to the horizontal (X-Y) or support plane defined by the support surface S (e.g. FAB floor, see FIG. 7) supporting the apparatus 10. FIG. 6A shows an example of plate 14B2 forming X reference datum 14R2. Plate 14B2 may have an elongated slot 14R22 formed therein as shown in FIG. 6A. The elongated slot defines the X constraint 14DX as will be seen below. Plate 14DX is located so that slot 14R22 is located at the known distance and may be mounted to the front face 14F of the apparatus in a manner similar to plate 14B1. When mounted, the slot 14R22 is substantially parallel to the normal of the plane of the support surface S. Each plate 14B1, 14B2 has a fastening hole 14H for receiving a mating fastener (see FIG. 8) on the movable section 18. In alternate embodiments, the Y and X reference datums may be formed by any other desired means such as different structural members, by electronic or by electro-optical means.

Figure 8:
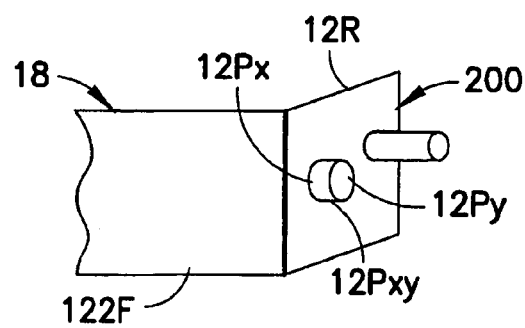
FIG. 8 is a schematic partial perspective view of a section of the movable portion in FIG. 3 showing another portion of an alignment system for aligning and mounting the movable portion of the processing apparatus.

Referring again to FIG. 7 and as noted before, movable section 18 has conjugal mounting interface portion 200A of positioning system 200. As seen in FIG. 7, in this exemplary embodiment the interface portion 200A is positioned on the rear face of the movable section, in a position that reflects the arrangement and positioning of mating interface portion 200B on the front face 14F of the rear section 14 (see FIG. 6). Mounting interface portion 200A includes positioning feature 12R, arranged as will be described in greater detail below, to conjugally interface or operate with the position constraint features 14DY, 14DX of the mating interface portion 200B. Mounting interface portion 200A may generally also include mechanical and other interface couplings (e.g. power communication systems) for operably connecting the movable section 18 to the tool when in the installed position. FIG. 8 is a partial view of the movable section showing the positioning feature 12R of the mounting interface portion 200A of the movable section 18 in this exemplary embodiment. As seen in FIG. 8 the position feature 12R in this embodiment is formed by pins or posts 12PXY. The positioning feature 12R has two pins 12PXY corresponding to the Y and X reference datums 14R1, 14R2 of mating interface portion 200B (see FIG. 6). The pins 12 PXY are substantially similar. One pin 12PXY is shown in FIG. 8 for example purposes. As seen in FIG. 8, the pins 12PXY depend from the frame 122 of the movable section 18. Attachment of the pins 12PXY to the frame may be by any suitable means. The location of pins 12PXY on the frame 122, shown in FIG. 8 as being somewhere on the base 122B of the frame 122, is loosely controlled. Accordingly, there may be substantial variance in the location of the locating pins, similar to pins 12PXY, on the frames of different movable sections similar to movable section 18. Hence, as may be realized the frame 122 and other structure (with the exception of the automation component mounting interfaces 22SM, 22TM on component mounting structures 22S, 22T) of the movable section 18 is not repeatably located relative to the apparatus 10. However, as will be seen below the features of the exemplary embodiment provide a repeatable location of the automation components 34, 38, 25, and hence the automation engine formed thereby, relative to the apparatus 10 with substantially no variation in location between different movable sections similar to section 18. Pins 12PXY may be made of any suitable material such as metal, plastic or ceramic. As seen in FIG. 8, pin 12PXY may have a generally cylindrical shank portion 12PX terminating in a rounded end 12PY. The cylindrical portion 12PX may be sized to be received into the slot 14R22 of plate 14B2 forming the X constraint 14DX on the rear section 14 (see FIG. 6A). The cylindrical portion 12PX may form a close sliding fit with the slot 14R22. This allows the cylindrical portion 12PX of the pin to slide along the slot length, which as noted before is oriented in the Z direction (i.e. in the direction normal to the apparatus support plane S, see FIG. 7). As may be realized, engagement between the cylindrical portion 12PX of the pin 12XY and slot 14R22 of the apparatus position reference 14R2, establishes the location along the X axis. If desired, a tapered shank portion (not shown) may be provided between cylindrical portion 12PX and the end 12PY of the pin to ease insertion of the pin into slot 14R22. The rounded end 12PY of the pin 12PXY contacts the flat surface 14F1 (see FIG. 6) of plate 14B1 forming the Y reference 14R1 and Y constraint 14DY, when movable section 18 is in the installed position. The rounded end 12PY of the pin 12PXY provides substantial point contact against the flat surface 14F1 of the plate to establish the location along the Y axis. The rounded end 12PY is unrestrained and can slide along the flat surface 14F1 in the Z and X directions to satisfy the X constraint and other alignment constraints. In alternate embodiments, the positioning features 12R may be provided by any other desired structural, mechanical or electrical means that operate in conjunction with the reference datum of the mounting interface of the rear section for positioning.

As noted before, the automation components (e.g. transport apparatus 34, aligner 38, load ports 25, traverser (not shown) are mounted on the movable section 18 to provide a repeatable location on each movable section similar to section 18. Before attachment of the respective automation component to the corresponding automation component mounting structure 22S, 22T, 22R, the automation component is located in relation to a locating reference independent of the dimensional variances of the structure of the movable section 18 or of the apparatus 10. In this embodiment, the automation components may be positioned and aligned with respect to the support surface S (see FIG. 7) and the X, Y locating features provided by the positioning feature 12R of the movable section mounting interface portion 200A. For example, the transport apparatus 34 may be located so that the shoulder axis of rotation ZR (see FIG. 4) is located at a known location relative to the X positioning pin 12PXY and the Y positioning pin 12PXY. The transport apparatus 34 is also oriented so that the substrate holding plane provided by the end effector 36E is substantially parallel to the plane of the support surface S. Thus, the transport apparatus 34 is placed in a repeatable location, based on the independent positioning references, in every movable section similar to movable section 18 with substantially no variation in transport apparatus location between different movable sections. Hence, dimensional variances in the structure of the movable section 18 or in the apparatus 10 do not affect positioning of the transport apparatus 34. Similarly, the aligner 38 may also be located so that the aligner axis of rotation (not shown) is at a known location from the X,Y, positioning feature 12R, and the substrate holding plane is level with the support plane S. In alternate embodiments, the aligner may be leveled with respect to the substrate holding plane provided by the transport apparatus end effector 36E. Leveling and positioning of the automation components may be accomplished using any suitable mechanical or electronic means. All other automation components may be positioned in a similar manner to that described above. In the case of the traverser, it is leveled with respect to the support plane. The load ports 25 are leveled to the substrate holding plane of the end effector 36E. Thus, each automation component (and collectively the automation engine) on the movable section is in a repeatable location relative to the desired independent references of the apparatus 10 (e.g. front face 100F and centerline of load lock 100) and the support planes with no substantial variance between different movable sections.

With the respective automation components positioned in the repeatable location, the mounting interface 22SM, 22TM of the automation component mounting structure may be adjusted or formed to engage/interface with the mating mounting interface 34MI of the automation component and allow attachment of the automation component to the mounting structure of the movable section. The repeatable location of the respective component mounting interface, provided as described above, and the repeatable location of the automation component itself, also described above, result in the mounting interface 22SM, 22TM of the movable section mounting structure being in a known repeatable location that does not vary substantially between movable sections. The repeatable location with substantially no variance of the component mounting interface 34MI, 38MI, of the automation component 34, 38 itself and of the corresponding mounting interface 34MI, 38MI of the automation component 34, 38 itself and of the corresponding mounting interface 22SM, 22TM on the mounting structure enable any desired automation component on the movable section to be immediately swapped on the movable section with an interchangeable component without readjustment in the component mounting interface, to component location, relative to either the movable section or the apparatus, or the mounting interface on the mounting structure. This is not possible with conventional devices.

The repeatable location of the movable section automation engine, provided as described before, also enables the movable section 18 to be swapped between similar processing apparatus without positional adjustment of the automation engine relative to the rear section 14 at least in the X and Y directions. However, it may be desired to level the automation engine so that the substrate handling plane, as may be defined by the transport apparatus end effector 36E, is substantially level with the substrate handling plane 14S (see FIG. 6) of the processing tool/rear section 14. The reason for this leveling is that the substrate handling plane 14S of the rear section 14 may not be sufficiently level with the support plane S. Accordingly, as noted before, the movable section may have an integral adjustment system 20 to facilitate leveling the automation engine to the handling plane 14S of the rear section. As will be described further below, the adjustment system 20 is capable of rotating the movable section 18 as a rigid body about the Y and X axis (in the directions indicated by arrows θy, θx in FIG. 6) relative to the rear section to effect leveling.

In summary, the installation of automation components on the movable section 18 is accomplished in the following manner. Each automation engine is provided with mounting interfaces 34MI, 38MI positioned in a known repeatable location (such as by using fixture tool 500). The movable section 18 and non-movable/rear section 14 of the apparatus 10 are provided with an interface system 200 having locating features 14R, 12R located from independent references of the apparatus 10 (e.g. front face 100F of load lock 100 and centerline of load lock slot valve). At installation of each automation component is positioned with respect to the locating features, that are independent of variances in the movable section structure. Also, at installation, the transport apparatus 34 is level to the support plane S, the traverser is level to the support plane, the aligner 38 is level to the support plane (or end effector). The load port 25 (in particular the pod carrier load interface) is level to the end effector. The FAB automated material handling system, that interfaces with the load port pod carrier, is level to the load port. The movable section 18 when installed, is adjusted to level the automation engine to the substrate handling plane of the rear section.

Figure 9A:
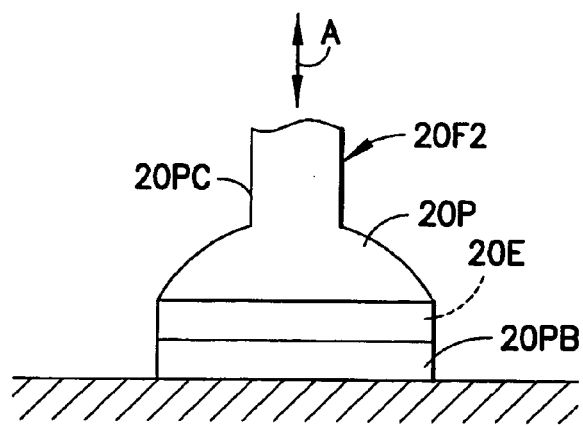
FIG. 9A is a schematic partial elevation view of an adjustable support of the movable portion.

The integral adjustment system 20 of the movable section 18 is shown in FIG. 9 in accordance with one exemplary embodiment. The adjustment system 20 employs three point leveling. As seen in FIG. 9, in this embodiment the adjustment system has three leveling points 20F1, 20F2, 20R. The leveling points 20F1, 20F2, 20R are distributed around the base 122B of the frame 122 to stably support the movable section 18 and automation components thereon. Though shown as located along the base perimeter, the leveling points may be arranged inwards from the perimeter. The arrangement of the leveling points shown in FIG. 9 is merely exemplary, and may be representative of but one of the many suitable placement arrangements that may be used for the leveling points. In the embodiment shown in FIG. 9, the leveling points are arranged along front and rear ends of the base 122B. By placing the leveling points at opposite ends, or as far apart as possible, stability is improved as is adjustability. There is one rear leveling point 20R located proximate the rear 122R of the base. There are two front leveling points 20F1, 20F2, located proximate the front end 122F of the base 122. In this embodiment, the rear leveling point 20R is located generally in the middle of the rear end. The two front leveling points 20F1, 20F2 are placed as far apart as possible, proximate the opposing lateral sides of the base as shown. Each leveling point 20F1; 20F2, 20R has a leveling pad 20P. The leveling pads 20P used at the three leveling points are substantially similar. FIG. 9A shows an elevation view of a leveling pad 20P. The leveling pad 20P generally has a base section 20PB and a connection section 20PC that connects the pad to the base structure 122B. The connection section 20PL may be in part or in whole a threaded rod that may be rotated within a threaded whole in order to generate the adjustment motion in the leveling pad. For example, the rod may be fixed to the base section 20PB and threaded into a threaded hole (not shown) in the base. To adjust the height of the pad (i.e. move base 20PB relative to the frame 122B in the direction indicated by arrow A in FIG. 9A) the base may be rotated clockwise or counter-clockwise thereby moving the threaded rod in or out of the hole base and changing the height of the leveling pad. In alternate embodiments, the base section of the pad may have a threaded hole for the rod, the adjustment rod being rotatable relative frame base but otherwise fixed in the Z direction relative to the frame base. In this case relative rotation between the threaded rod and base section again changes the height of the leveling pad relative to the frame base. In alternate embodiments, the leveling pads may have any other desirable arrangement.

As may be realized, the rear leveling point 20R is difficult to access, especially when the movable section is proximate its installed position (see FIG. 7). Accordingly, in this embodiment, the leveling pad 20P of the rear leveling point 20R may be set to a predetermined height and remain fixed at that height during positional adjustment of the movable section. Hence, the rear leveling point 20R may be used to establish the Z height during alignment and registration of the movable section with interface system 200 described before. Tip and roll (rotation in the direction indicated by arrows θy, θx) adjustment of the movable section, and hence of the automation engine, is performed with the front leveling points 20F1, 20F2. For example, in order to tip the movable section forwards, the pads of the front leveling points 20F1, 20F2 may be adjusted (in unison if no roll component is involved) to lower the front relative to the back of the base. For roll, the front leveling points 20F1, 20F2 are adjusted in height relative to each other. The adjustment system 20 also includes a stabilization system 20S. As may be realized, the three point leveling system is ideal for leveling the movable section. However, stability of the movable section when supported by three points may be limited under various loading conditions especially in view of the potential shift in the CG of the automation engine due to movement of the traverse. The stabilization system 20S augments the stability provided by the leveling points without interfering with the leveling precision provided by the three leveling points. In this embodiment, the stabilization system 20S has two stabilization pads. In alternate embodiments, more or fewer stabilization pads may be used. As seen in FIG. 9, the stabilization pads 20S may be located to be effective in providing stability around the single rear leveling point 20R. In alternate embodiments, the stabilization pads may be located anywhere where stabilization of the movable section is desired. The stabilization pads 20S are generally similar to leveling pads 20P, shown in FIG. 9A, except that the base section includes a rubber or elastomeric layer 20E (shown in phantom in FIG. 9A) that is compressed a desired amount. Thus, the stabilization pads are sufficiently flexible to not affect the leveling motions provided with the leveling points 20F1, 20F2, 20R, but of sufficient stiffness to stabilize the movable section 18. The desired preload or compression on the elastomeric layer 20E may be achieved by threading the rod of the connection section 20PL to a predetermined torque, or establishing a desired unloaded pad height determined to cause the desired elastomeric compression when loaded by expected loads from the movable section.

Figure 10:
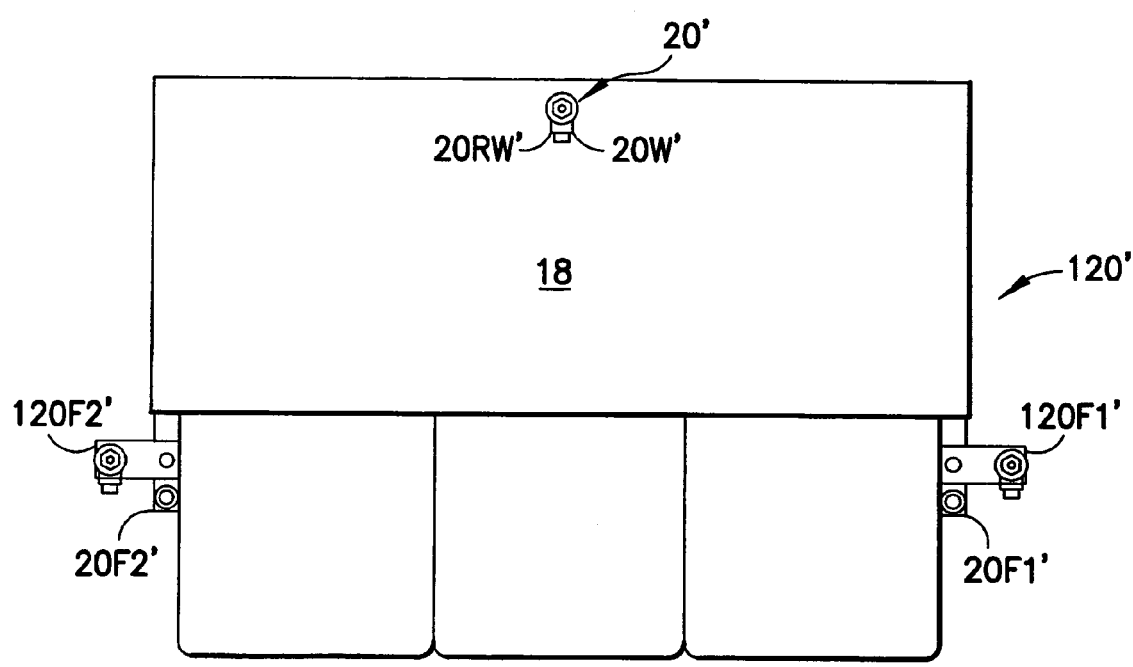
FIG. 10 is a plan view of the movable portion of the apparatus, in accordance with another exemplary embodiment, that shows a self transport system of the movable portion.

Referring now to FIG. 10, there is shown a movable section 18 of processing apparatus with an integral adjustment system 20' and transport system 120' in accordance with another exemplary embodiment. The adjustment system 20' in this embodiment is substantially similar to adjustment 20 described before and shown in FIGS. 9-9A except as otherwise described. Similar features are similarly numbered. Adjustment system 20' is also a three point leveling system. It has two front leveling points 20F1', 20F2' and a single rear leveling point 20RW'. The front leveling points 20F1', 20F2' are substantially the same as the front leveling points of adjustment system 20. The rear leveling point 20RW' is, in this embodiment, a wheel or roller. In the exemplary embodiment the rear leveling point 20RW' includes a wheel or roller element 20W' that is part of the transport system 120'. The roller may be incorporated into a caster assembly. The caster assembly may be located at the bottom of an adjustable connecting portion similar to the rod forming connecting portion 20PC in FIG. 9A. The caster assembly may also be capable of swiveling to allow the rolling element, in the event it is capable only of uniaxial rotation, to point in the desired direction of travel. Leveling of the automation engine with the adjustment system 20', in this embodiment, is substantially the same as described before with respect to adjustment system 20. As seen in FIG. 10, the transport system 120' may further include front casters 120F1', 120F2'. The front casters 120F1', 120F2' may be removably mounted on the movable section 18 to enable transport of the movable section as described before. When moving the movable section with the transport system 120', the caster of the rear leveling point 20RW' serves along with the other casters or rollers of the transport system 120' to transport the movable section.

In still other embodiments, the transport system 20 on the substrate 122 of the movable portion may be dependent from the fixed frame 22 of the front section 18. For example, the transport system may include a series of interlocking slides system (e.g. a fixed slide portion mounted on frame 22 and a complementing movable slide portion on the substrate 122 of the movable portion 18), or a system of rails and rollers (e.g. rollers mounted on frame 22 and rails on subframe 122) or any other movement system allowing relative motion of the movable portion 18 to the displaced position in the separation zone S (see FIG. 3) while maintaining dependence of the movable portion from the fixed portion. The dependent mounting system may form part of the standard mounting interface 200A, 200B allowing repeated precise reinstallation of the movable portion 18 into the fixed portion of the housing 24/frame 27.

As may be realized, the standard mounting interface 200A, 200B provided on the movable portion 18 and fixed portions of the front section 12 of the apparatus allow the movable portion 18, if desired, to be swapped between processing apparatus having similar front sections 12 as apparatus 10 (and indeed between any front sections with the standard mounting interface 200A, 200B, whether similar or dissimilar). For example, the movable portion 18 may be drawn, on its movement system 20 from its installed position, to the removed position shown in FIG. 3. Though sufficient space is provided for maintenance access on the automation components in this position, it may be desired to remove the movable portion and perform the maintenance out of the fab bays. In the interim (during the time maintenance is performed and to minimize processing apparatus down time) another movable portion (not shown) and if desired similar to movable portion 118 including a standard mounting interface the same as mounting interface portion 200A, may be mounted/installed into the fixed portion of the housing either as a temporary or permanent replacement. Upon completion of maintenance on the automation components, or any other desired portion, of movable portion 18, the movable portion 18 may be returned to the installed position on the fixed portion of the front section 12 from which portion 18 was removed or may be installed into a fixed portion of another apparatus. The standard mounting interface ensures repeatable accurate placement of the movable portion 18 into the fixed portion of the front section 12 whether the movable portion 18 is returned to the same apparatus 10 from which removed or installed into a different apparatus. As may be seen in FIG. 3, the standard mounting interface 200A, 200B may incorporate electronic components such as suitable couplers/connectors (not shown) forming a connection, that is easily coupled and uncoupled during partition/reinstallation of the movable portion 18, for the electrical power and data transmission systems of the automation components. The couplers in the interface 200A/200B or electronics of the automation components (load ports 25, transport apparatus 34, aligner 38) on the movable portion 18 and controller 400 may be configured to have "plug and play" polling in order to identify when the movable portion 18 is properly mated. Memory may also be provided to identify the particular components 25, 34, 38 on a given movable portion 18, so that the controller is capable of identifying if a different movable portion has been installed in the apparatus during maintenance. This additionally allows for common spares across processing apparatus within a semiconductor fab.

Figure 11:
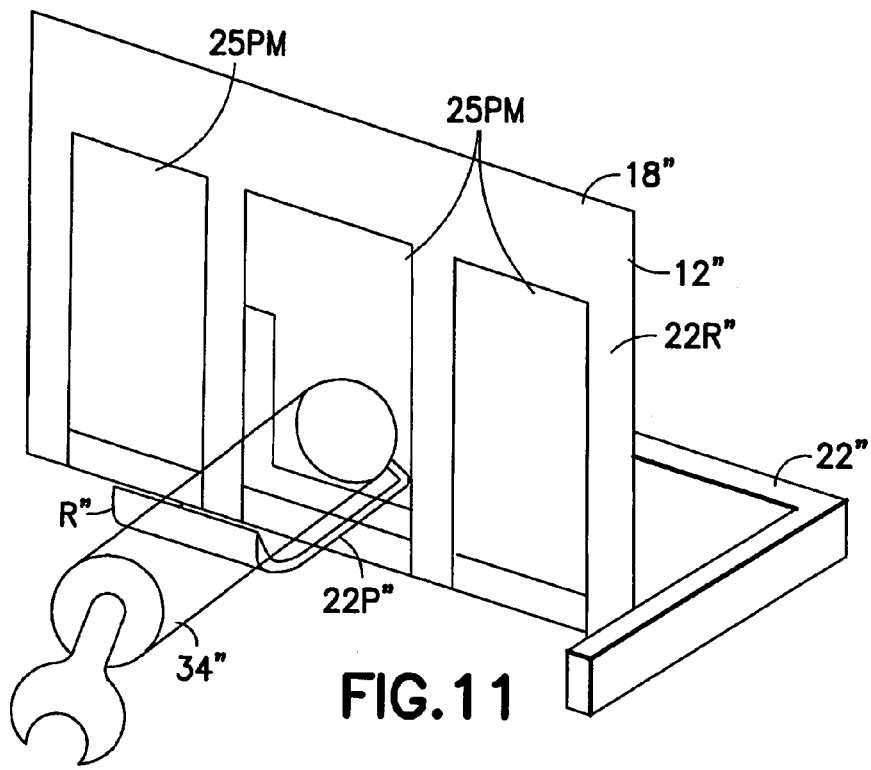
FIG. 11 is a schematic perspective view of the movable portion of the apparatus, in accordance with still another exemplary embodiment, and showing a section in a moved position.
Figure 11A:
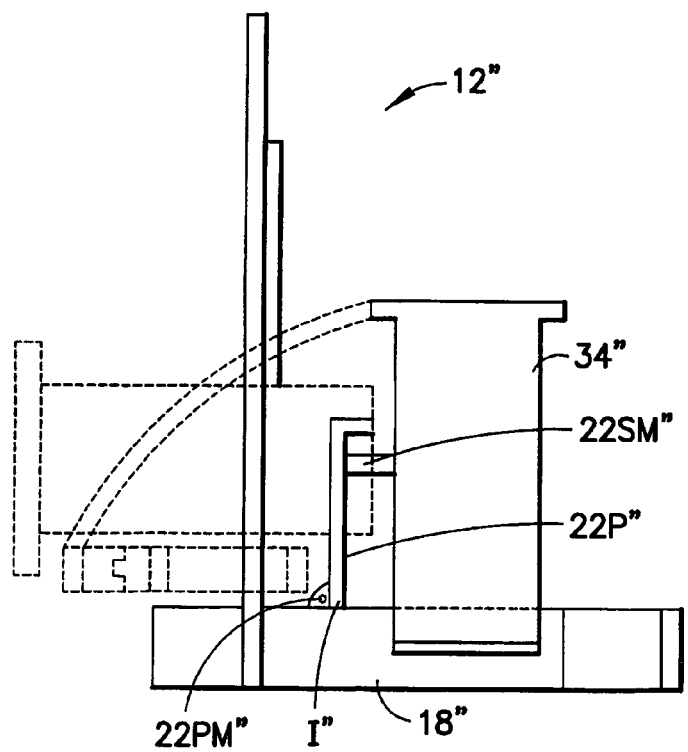
FIG. 11A is a schematic elevation view of the movable portion in FIG. 11 showing the section of the movable portion in an installed position and in the moved position (in phantom) shown in FIG. 11.

Referring now to FIGS. 11-11A, there is shown a portion of the front section 12" of the substrate processing apparatus in accordance with another exemplary embodiment. Except as otherwise noted below, the features of the front section 12" are substantially similar to the front section 12 of apparatus 10 described before and shown in FIGS. 1-4. Similar features are similarly numbered. Front section 12" in this embodiment may have a movable section 18" similar to movable section 18 described before. In alternate embodiments, the front section 12" may not have a self supporting movable section. As seen in FIG. 11, the front section 12" in this embodiment may have three load port mounting locations 25P'" (the load ports are not shown for clarity). In alternate embodiments, the front section may have more or fewer load port mounting locations. The frame 22" of the front section 12" has a front mounting structure 22R" to which load port modules similar to load port modules 25 shown in FIGS. 2 and 3, may be mounted. The load port mounting locations 25P'" may be openings formed in the front mounting structure 25R". As seen in FIGS. 11-11A, in this embodiment the frame 22" of the front section 12" may have a pivotable section 22P'". The pivotable section 22P'" may be pivoted from a raised position I" to a lowered position R". The pivotable section 22P'" may be positioned on the frame 22", so that when pivoted between its raised and lowered positions I", R" the pivot section passes through one of the openings formed in the front mounting structure 22R" defining a load port mounting location 25". The pivot section 22P'" may have any suitable shape and structure and may have a pivot mount 22PM" enabling the pivot section to be rotated relative to the frame 22" as shown in the figures. As seen in FIGS. 11-11A, the transport apparatus 34", which is similar to apparatus 34, is mounted to and supported from the pivot section 22P'". Thus, the pivot section 22P'" has a mounting interface similar to transport apparatus mounting structure interface 22SM described before. When the pivot section 22P'' is pivoted about pivot mount 22PM'', the transport apparatus 34'' is pivoted with the pivot section as a unit. As seen in FIGS. 11-11A, when the pivot section is lowered to its lowered position R'', the transport apparatus 34'' is rotated out of the front section 12'' through the opening in the front mounting structure 22R''. The pivot mount 22PM'' may be located as desired with respect to the pivot section 22P'' to facilitate ease of rotation of the pivot section with the transport apparatus 34'' thereon. The location of the pivot mount 22PM'' shown in FIG. 11A is merely for drawing clarity. The pivot section 22P'' may also be provided with suitable locks to lock the pivot section in the raised position I''. As may be realized from FIG. 11, when the pivot section is lowered, the transport apparatus 34'' is accessible and may be removed and replaced if desired.

It should be understood that the foregoing description is only illustrative of the invention.

Various alternatives and modifications can be devised by those skilled in the art without departing from the invention. Accordingly, the present invention is intended to embrace all such alternatives, modifications and variances which fall within the scope of the appended claims.

What is claimed is:

1. A substrate processing apparatus comprising:
    a frame;
    a housing connected to the frame;
    an access system connected to the frame and forming an access through which substrates are moved in and out of the housing; and
    at least one substrate processing device connected to the frame for processing substrates and being at least partially positioned in the housing, the at least one substrate processing device comprising a substrate transport apparatus;
    wherein the frame comprises a movable portion, movable relative to the housing, to which the access system and substrate processing device are connected so that movement of the movable portion causes separation of the access system and the at least one substrate processing device as a unit from an installed position;
    wherein the substrate transport apparatus is selectable from a number of different interchangeable substrate transport apparatus each having a predetermined reference datum and positioning features for positioning the substrate transport apparatus relative to the frame, the positioning features of each respective substrate transport apparatus being controllably located relative to its predetermined reference datum to be in a repeatable predetermined location with substantially no variance between the positioning features of the other ones of the different interchangeable substrate transport apparatus, wherein the substrate transport apparatus comprises an articulated arm with an end effector for holding and transporting substrates in the housing and wherein the predetermined reference datum of the substrate transport apparatus is a plane of the end effector or an axis of rotation of the articulated arm.

2. The processing apparatus according to claim 1, further comprising a substrate processing tool connected to the housing for processing substrates transported into the housing via the access system.

3. The processing apparatus according to claim 1, wherein the substrate transport apparatus further comprises a traverser, and wherein the articulated arm is mounted on the traverser.

4. The processing apparatus according to claim 1, wherein the positioning features are controllably located relative to the predetermined reference datum with an alignment fixture.

5. A substrate processing apparatus comprising:
    a frame;
    a housing connected to the frame;
    an access system connected to the frame and forming an access through which substrates are moved in and out of the housing; and
    at least one substrate processing device connected to the frame for processing substrates and being at least partially positioned in the housing, the at least one substrate processing device comprising a substrate transport apparatus;
    wherein the frame comprises a movable portion, movable relative to the housing, to which the access system and substrate processing device are connected so that movement of the movable portion causes separation of the access system and the at least one substrate processing device as a unit from an installed position;
    wherein the substrate transport apparatus is selectable from a number of different interchangeable substrate transport apparatus each having a predetermined reference datum and positioning features for positioning the substrate transport apparatus relative to the frame, the positioning features of each respective substrate transport apparatus being controllably located relative to its predetermined reference datum to be in a repeatable predetermined location with substantially no variance between the positioning features of the other ones of the different interchangeable substrate transport apparatus, wherein the at least one substrate processing device comprises both the substrate transport apparatus and a substrate processing tool, the substrate transport apparatus and substrate processing tool both being mounted to the movable portion and defining a substrate automation engine, wherein movement of the movable portion relative to the housing moves the automation engine as a unit relative to the housing, wherein the substrate processing tool is selectable from a number of different interchangeable substrate processing tools each having a processing tool predetermined reference datum and processing tool positioning features for positioning the substrate processing tool relative to the frame, the processing tool positioning features of each substrate processing tool being controllably located relative to its processing tool predetermined reference datum to be in a rep eatable location with substantially no variance between the different interchangeable substrate processing tools.

6. The processing apparatus according to claim 5, wherein the processing tool is a substrate aligner, and the processing tool predetermined reference datum is a substrate seating plane of the substrate aligner.

7. The processing apparatus according to claim 5, wherein the automation engine has a mounting interface for mounting the automation engine to the movable portion, and wherein the automation engine is selectable from a number of different interchangeable automation engines, each of the automation engines, when mounted to the movable portion, being in a repeatable predetermined location, relative to another predetermined reference datum, with substantially no adjustment to the mounting interface of the automation engine and independent of positioning of the movable portion structure interfacing with the mounting interface.

8. The processing apparatus according to claim 7, wherein the mounting interface of the automation engine is defined at least in part by the positioning features of the substrate transport apparatus.

9. The processing apparatus according to claim 7, wherein the movable portion has a positioning feature disposed to locate the movable portion relative to the housing when the movable portion is in an installed position, and wherein the positioning feature of the movable portion defines the other predetermined reference datum.

10. The processing apparatus according to claim 9, wherein the positioning feature of the movable portion has a contact surface that interfaces with a mating portion for positioning the movable portion relative to the housing when the movable portion is in the installed position.

* * * * *